United States Patent
Joo et al.

(10) Patent No.: US 7,656,696 B2
(45) Date of Patent: Feb. 2, 2010

(54) RESISTIVE MEMORY DEVICE HAVING RESISTOR PART FOR CONTROLLING SWITCHING WINDOW

(75) Inventors: Won Jae Joo, Hwaseong-si (KR); Kwang Hee Lee, Suwon-si (KR); Sang Kyun Lee, Seongnam-si (KR); Yoon Sok Kang, Seongnam-si (KR); Won Joo Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 353 days.

(21) Appl. No.: 11/353,006

(22) Filed: Feb. 14, 2006

(65) Prior Publication Data

US 2006/0181317 A1    Aug. 17, 2006

(30) Foreign Application Priority Data

Feb. 14, 2005   (KR) ............... 10-2005-0011958
Aug. 19, 2005   (KR) ............... 10-2005-0076228

(51) Int. Cl.
  *G11C 11/00*   (2006.01)
(52) U.S. Cl. .............. 365/148; 365/158; 365/163
(58) Field of Classification Search .......... 365/148, 365/158, 163, 171, 173, 100; 257/2–4, E27.004, 257/E27.005
See application file for complete search history.

(56) References Cited

U.S. PATENT DOCUMENTS

| | | | | |
|---|---|---|---|---|
| 3,964,033 | A * | 6/1976 | Wasa et al. | 365/145 |
| 5,296,835 | A * | 3/1994 | Nakamura | 338/130 |
| 6,385,079 | B1 * | 5/2002 | Tran | 365/148 |
| 6,935,928 | B2 * | 8/2005 | Uchikura et al. | 451/36 |
| 6,937,507 | B2 * | 8/2005 | Chen | 365/163 |
| 7,085,151 | B2 * | 8/2006 | Ashton et al. | 365/148 |
| 7,221,599 | B1 * | 5/2007 | Gaun et al. | 365/189.01 |
| 7,283,383 | B2 * | 10/2007 | Kang | 365/148 |

* cited by examiner

*Primary Examiner*—David Lam
(74) *Attorney, Agent, or Firm*—Harness, Dickey & Pierce, P.L.C.

(57) ABSTRACT

A resistive memory device having a resistor part for controlling a switching window. The resistive memory device of this disclosure can control a switching window to assure operational reliability thereof. In addition, since the memory device is realized by additionally providing only the resistor part for controlling a switching window to various resistive memory devices, it can be easily fabricated and applied to all current and voltage driving type resistive devices.

5 Claims, 9 Drawing Sheets

RESISTIVE MEMORY DEVICE HAVING RESISTOR PART FOR CONTROLLING SWITCHING WINDOW

BACKGROUND OF THE DISCLOSURE

1. Field of the Disclosure

The present disclosure relates, generally, to a resistive memory device having a resistor part for controlling a switching window, and, more particularly, to a resistive memory device that additionally includes a resistor part for controlling a switching window, thus assuring a sufficiently large switching window, resulting in excellent operational reliability.

2. Description of the Related Art

In general, a large number of electronic memory devices include a bistable element to cause switching from high resistance to low resistance or vice versa upon the application of voltage. In particular, a resistive memory device means memory having resistance that varies with the applied voltage and storing data corresponding to such variations in resistance, as a concept contrasting with capacitive memory devices.

Chalcogenide materials, semiconductors, and various types of oxides and nitrides are known to have resistive memory properties. Further, it has been found that some organic materials have resistive memory properties. Although the resistive memory devices are disadvantageous because they have high driving voltage and current, low durability, and low thin film handling properties, the above problems may be overcome with the recent rapid development of material engineering technologies. Thus, resistive memory devices are receiving attention as multi-bit operating memory, which is nonvolatile and has low power consumption and high density. Examples of the resistive memory device include phase change RAM, organic memory, oxide resistive RAM, etc.

Of these memory devices, organic memory is composed of a memory matrix including a lower electrode, an upper electrode, and an organic memory layer sandwiched between the lower and upper electrodes, in which a cell, formed at the position where the upper electrode overlays the lower electrode, provides the bistable properties.

In the resistive memory device, a memory cell typically exhibits two resistance states, that is, a low resistance (set) state and a high resistance (reset) state, in which if the low resistance state is defined as data "1" and the high resistance state is defined as data "0", the two logic states of data may be stored in the memory cell. Such two states may be switched by application of voltage or current. As such, a difference in voltage or current between the two states is referred to as a switching window.

However, at present, it is difficult to assure the switching window in oxide resistive RAM or organic memory. In particular, organic memory is more severely problematic due to the wide driving voltage distribution. FIG. 1 is a graph showing the results obtained by measuring only the voltages corresponding to the set-reset states through the voltage sweep following the application to organic memory. From FIG. 1, it can be seen that the switching window is difficult to assure due to the wide driving voltage distribution.

In the resistive memory device, a difference between the voltage (current) inducing the set state and the voltage (current) inducing the reset state should be sufficiently ensured so as to enable reliable operation of the device. However, conventional resistive memory devices have problems in being incapable of ensuring the switching window, resulting in decreased operational reliability of the device.

SUMMARY OF THE DISCLOSURE

Accordingly, the present disclosure has been made keeping in mind the above problems occurring in the related art, and an object of the present disclosure is to provide a resistive memory device which can control switch driving voltage and current by connecting a resistor part for controlling a switching window to the memory device.

Another object of the present disclosure is to provide a resistive memory device which can be used as WORM (Write Once Read Memory) type memory, with excellent operational reliability.

In order to accomplish the above objects, the present disclosure provides a resistive memory device which additionally has a resistor part for controlling a switching window connected to the memory device.

In the present disclosure, the resistor part for controlling a switching window may be connected to the outside of the memory device or may be provided within the memory device.

BRIEF DESCRIPTION OF THE DRAWINGS

The above and other objects, features and advantages of the present disclosure will be more clearly understood from the following detailed description taken in conjunction with the accompanying drawings, in which.

DESCRIPTION OF THE PREFERRED EMBODIMENTS

Hereinafter, a detailed description will be given of the present disclosure, with reference to the appended drawings.

In the present disclosure, the term "resistor part for controlling a switching window" means a part connected to a resistive memory device to distribute voltage. The construction of the resistor part for controlling a switching window is not particularly limited in the present disclosure, and may be in a conventional ceramic resistor form or may be formed as a single layer in the memory device.

The resistive memory device of the present disclosure is characterized by comprising a resistive memory device for storing data corresponding to variation of resistance and a resistor part for controlling a switching window connected to the memory device. The resistive memory device of the present disclosure comprises a lower electrode, an upper electrode, and a resistive memory layer formed between the lower and upper electrodes. In the case where appropriate voltage is applied to the memory device, the resistive memory layer functions to cause switching from low resistance to high resistance or vice versa.

The resistor part for controlling a switching window, connected to the memory device of the present disclosure, may be provided in the memory device or connected to the outside of the memory device. As such, the resistor part for controlling a switching window may be formed in various shapes.

Figure 1:
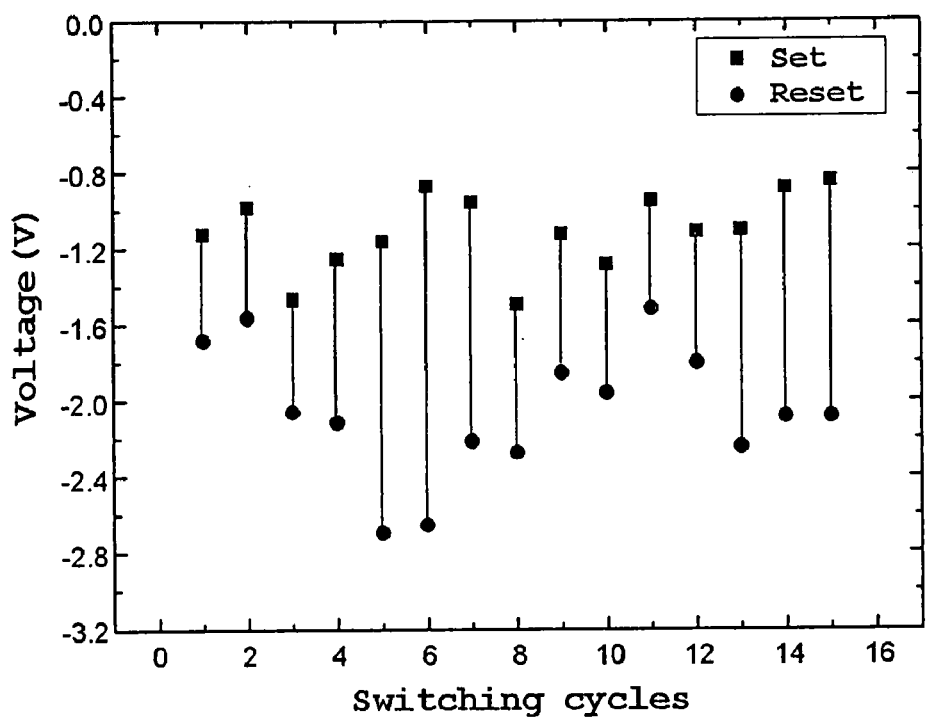
FIG. 1 is a graph showing the switching window of a conventional resistive memory device.
Figure 2:
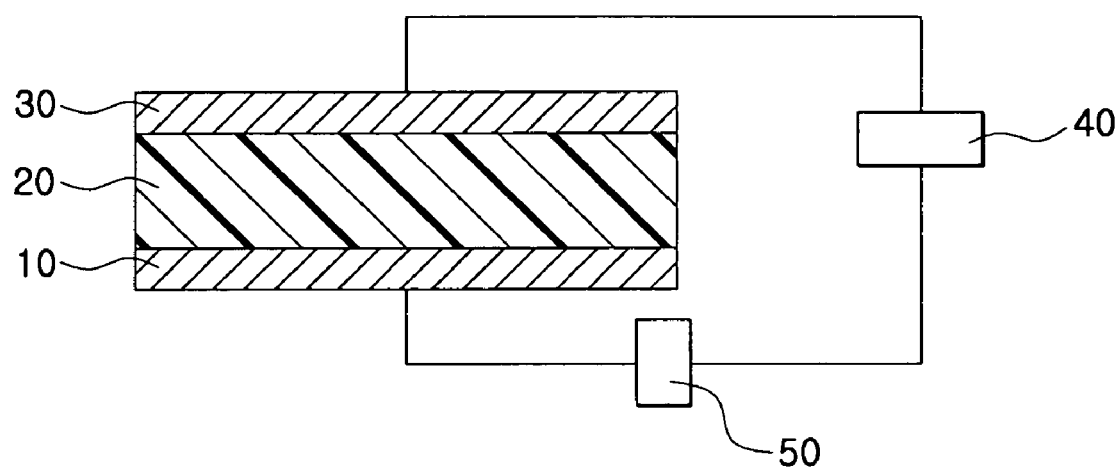
FIG. 2 is a schematic cross-sectional view showing a resistive memory device, according to a first embodiment of the present disclosure.

FIG. 2 illustrates a resistive memory device according to a first embodiment of the present disclosure, which has a resistor part for controlling a switching window connected to the outside of the memory device. As is apparent from FIG. 2, the resistive memory device, according to the first embodiment of the present disclosure, includes a lower electrode 10, an upper electrode 30, a resistive memory layer 20 sandwiched between the lower electrode 10 and the upper electrode 30, a power supply part 40, and a resistor part 50 for controlling a switching window that is connected in series between the power supply part 40 and the memory device. The power supply part 40 functions to apply the biased voltage to the resistive memory layer 20 through the lower and upper electrodes 10 and 30, so that the resistive memory layer 20 is switched from low resistance (set) state to high resistance (reset) state or vice versa.

Figure 3A:
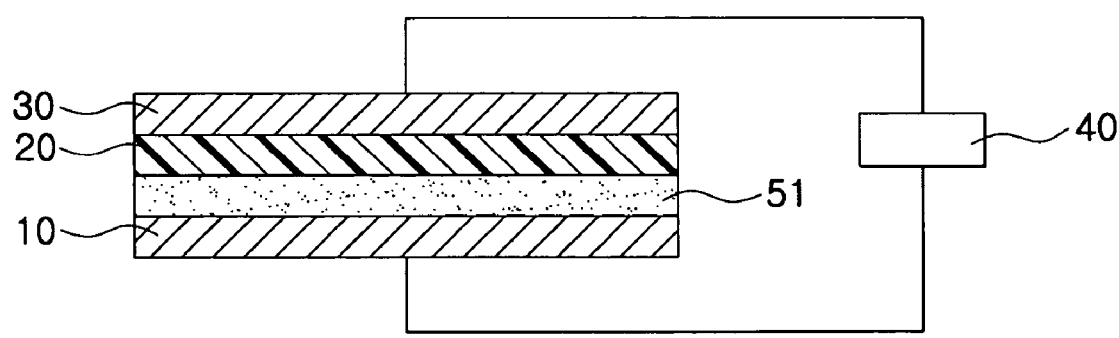
FIGS. 3A to 3C are schematic cross-sectional views showing a resistive memory device, according to a second embodiment of the present disclosure.

FIG. 3A illustrates a resistive memory device having a resistor part for controlling a switching window provided therein, according to a second embodiment of the present disclosure. As shown in FIG. 3A, the resistive memory device, according to the second embodiment of the present disclosure, includes a lower electrode 10, an upper electrode 30, a resistive memory layer 20 sandwiched between the lower and upper electrodes 10 and 30, and a resistor part 51 for controlling a switching window that is formed as a single layer on the lower electrode 10.

The resistor part for controlling a switching window may be variously formed, in addition to the structures shown in FIGS. 2 and 3A. For example, resistance of a metal wire may be used in a resistor part for controlling a switching window. As such, the kind, length, thickness or shape of metal wire used as the resistor part is adjusted, thus controlling a switching window.

Figure 3B:
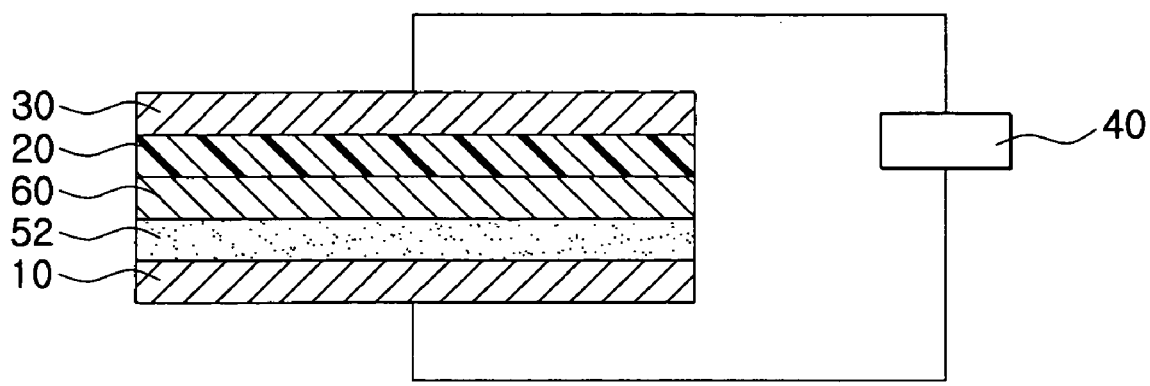
Figure 3C:
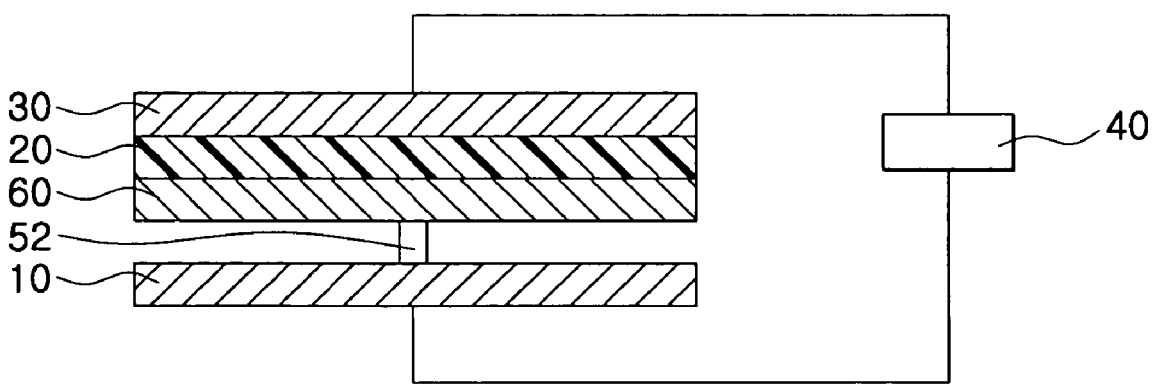

FIGS. 3B and 3C illustrate resistive memory devices, according to modifications of the second embodiment of the present disclosure. As seen in FIG. 3B, the resistive memory device further includes a metal layer 60 formed on a resistor part 52 for controlling a switching window. In such a case, the metal layer 60 is formed of a material selected from the group consisting of aluminum, copper, gold, silver, titanium, platinum, tungsten, indium tin oxide, etc., but is not limited thereto. In addition, the metal layer 60 may be formed to a thickness of 1 to 100 nm using vacuum deposition. Alternatively, as shown in FIG. 3C, a resistor part 52 for controlling a switching window may be provided in the form of a thin metal wire.

In the present disclosure, the resistor parts 51 and 52 for controlling a switching window may be formed of an organic semiconductor material or an inorganic semiconductor material. The inorganic semiconductor material is selected from the group consisting of intrinsic semiconductors, such as silicon (Si), germanium (Ge), or carbon (C), extrinsic semiconductors, and compound semiconductors. The extrinsic semiconductor is obtained by adding an appropriate dopant to the intrinsic semiconductor, in which examples of the dopant include, but are not limited to, Group III elements, such as B, Al, Ga, or In, or Group V elements, such as P, As or Sb.

In the present disclosure, examples of the compound semiconductor include, but are not limited to, Group III-V compounds such as gallium arsenide (GaAs) or gallium phosphide (GaP), Group II-VI compounds such as cadmium sulfide (CdS) or zinc telluride (ZnTe), Group IV-VI compounds such as lead sulfide (PbS), Group IV-IV compounds such as silicon carbide (SiC), or ternary alloy compound semiconductors such as InGaAs or $CuGaSe_2$.

Examples of the organic semiconductor include, but are not limited to, 2-amino-4,5-imidazoledicarbonitrile (AIDCN), tris-8-(hydroxyquinoline)aluminum ($Alq_3$), 7,7,8,8-tetracyanoquinodimethane (TCNQ), 3-amino-5-hydroxypyrazole (AHP), polyaniline, etc. In addition, a conducting polymer or an insulating polymer doped with a conducting moiety may be used.

Examples of the conducting polymer, which is usable as a material for the resistor part for controlling a switching window of the present disclosure, include, but are not limited to, polyacetylene, polyaniline, polypyrrole, polythiophene, polydiphenylacetylene, poly(t-butyl)diphenylacetylene, poly(trifluoromethyl)diphenylacetylene, poly(bistrifluoromethyl)acetylene, polybis(t-butyldiphenyl)acetylene, poly(trimethylsilyl)diphenylacetylene, poly(carbazole)diphenylacetylene, polydiacetylene, polyphenylacetylene, polypyridineacetylene, polymethoxyphenylacetylene, polymethylphenylacetylene, poly(t-butyl)phenylacetylene, polynitrophenylacetylene, poly(trifluoromethyl)phenylacetylene, poly(trimethylsilyl)phenylacetylene, and derivatives thereof.

In preferred cases, the insulating polymer doped with a conducting moiety may be used. Examples of the insulating polymer include, but are not limited to, polymethylmethacrylate (PMMA), polystyrene (PS), polycarbonate (PC), polyolefin, polyester, polyamide, polyimide, polyurethane, polyacetal, polysilicon and polysulfonate. Examples of the dopant include, but are not limited to, carbazole, terephthalic acid (TPA), 1-diphenyl-4,4-diamine (TPD), etc.

In the present disclosure, in the case where the resistor part 51 or 52 for controlling a switching window are provided in the switching device, it may be formed using any thin film formation process well-known in the art, such as spin coating, inkjet printing, roll-to-roll coating, thermal deposition, etc.

The lower electrode 10 and the upper electrode 30 each include at least one electroconductive material selected from the group consisting of metals, metal alloys, metal nitrides, metal oxides, metal sulfides, carbon, conducting polymers, and organic conductors. Specifically, examples of the electrode material include, but are not limited to, aluminum (Al), gold (Au), silver (Ag), platinum (Pt), copper (Cu), titanium (Ti), tungsten (W), and indium tin oxide (ITO).

The resistive memory device of the present disclosure is a resistive memory device having resistance varying with the applied voltage, such as organic memory, oxide resistive RAM, or phase change RAM.

The resistive memory layer 20 of the memory device of the present disclosure may have different structures, depending on the type of memory device. For example, in the case where the resistive memory device of the present disclosure is organic memory, the resistive memory layer 20 may be formed of at least one material selected from conjugated polymers, anisotropic conductive materials, organic semiconductors, and polymers containing intramolecular charge-transfer complex.

In addition, in the case where the memory device of the present disclosure is phase change RAM, the resistive memory layer 20 may be formed of chalcogenide materials, such as germanium-antimony-tellurium (Ge—Sb—Te), arsenic-antimony-tellurium (As—Sb—Te), tin-antimony-tellurium (Sn—Sb—Te), tin-indium-antimony-tellurium (Sn—In—Sb—Te), arsenic-germanium-antimony-tellurium (As—Ge—Sb—Te), niobium-antimony-tellurium (Nb—Sb—Te), tungsten-antimony-tellurium (W'Sb—Te), etc.

Below, operation of the resistive memory device of the present disclosure is described. The current-voltage curves (I-V curves) of a conventional resistive memory device ($V_{ext}$=0) having no resistor part for controlling a switching window and the resistive memory device ($V_{ext}$=100Ω) of the present disclosure are shown in FIG. 4.

Figure 4:
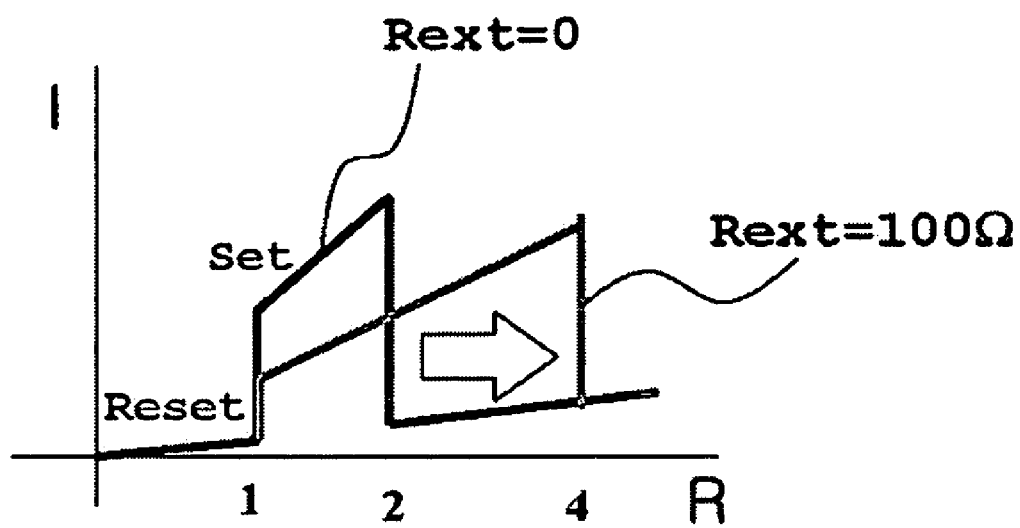
FIG. 4 is a graph showing the current-voltage (I-V) properties of the conventional resistive memory device and of the resistive memory device of the present disclosure.

Referring to FIG. 4, it can be seen that the resistive memory device has a set state of low resistance and a reset state of high resistance. The high resistance state corresponds to logic '0', and the low resistance state corresponds to logic '1'. Each of the two different resistance states may be maintained for a long time period even when voltage or current is not applied. When the current flow is detected through application of very low voltage, the corresponding state may be read. Thus, the device of the present disclosure may be used as a memory device.

Figure 5:
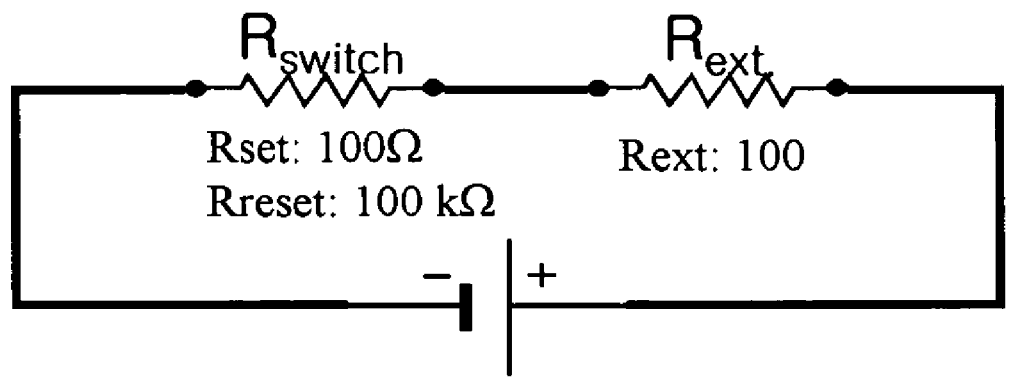
FIG. 5 is an equivalent circuit diagram of the resistive memory device having a resistor part for controlling a switching window, according to the present disclosure.

FIG. 5 illustrates the equivalent circuit of the memory device of the present disclosure shown in FIG. 2. Assuming that the circuit is formed in a manner such that a resistor part $R_{set}$ for controlling a switching window is connected in series to a resistive memory device $R_{switch}$, a divided portion of the total voltage applied to the overall circuit is applied to the memory device depending on the resistance ratio of two resistor parts $R_{switch}$ and $R_{ext}$ and thus the switch driving voltage and current of the memory device may be optionally controlled, as represented by Equation 1, below:

$$V_{switch} = \frac{R_{switch}}{R_{switch} + R_{ext}} V_{total} \quad \text{Equation 1}$$

In addition, the schematic circuit diagram shown in FIG. 5 is described on the assumption of resistance in a set state $R_{set}$ of 100Ω, resistance in a reset state $R_{reset}$ of 100 kΩ, threshold voltage required for switching from a reset state to a set state $V_{th\ (reset \to set)}$ of 1 V, and threshold voltage required for switching from a set state to a reset state $V_{th\ (set \to reset)}$ of 2 V.

In the case where the resistor part for controlling a switching window of 100Ω is connected, since $R_{reset}$ (100 kΩ) is much larger than $R_{ext}$ (100Ω) upon switching from the reset state to the set state, for example, upon the application of voltage of 1 V, almost all of the external voltage is applied to the memory cell. On the other hand, although the memory cell requires the voltage of 2 V for switching from the set state to the reset state, since $R_{set}$ (100Ω) is equal to $R_{ext}$ (100Ω), the voltage is applied to the memory cell in a state of being divided into ½. Thus, the total voltage of 4 V should be applied, in order to switch the memory cell from the set state to the reset state.

Figure 6:
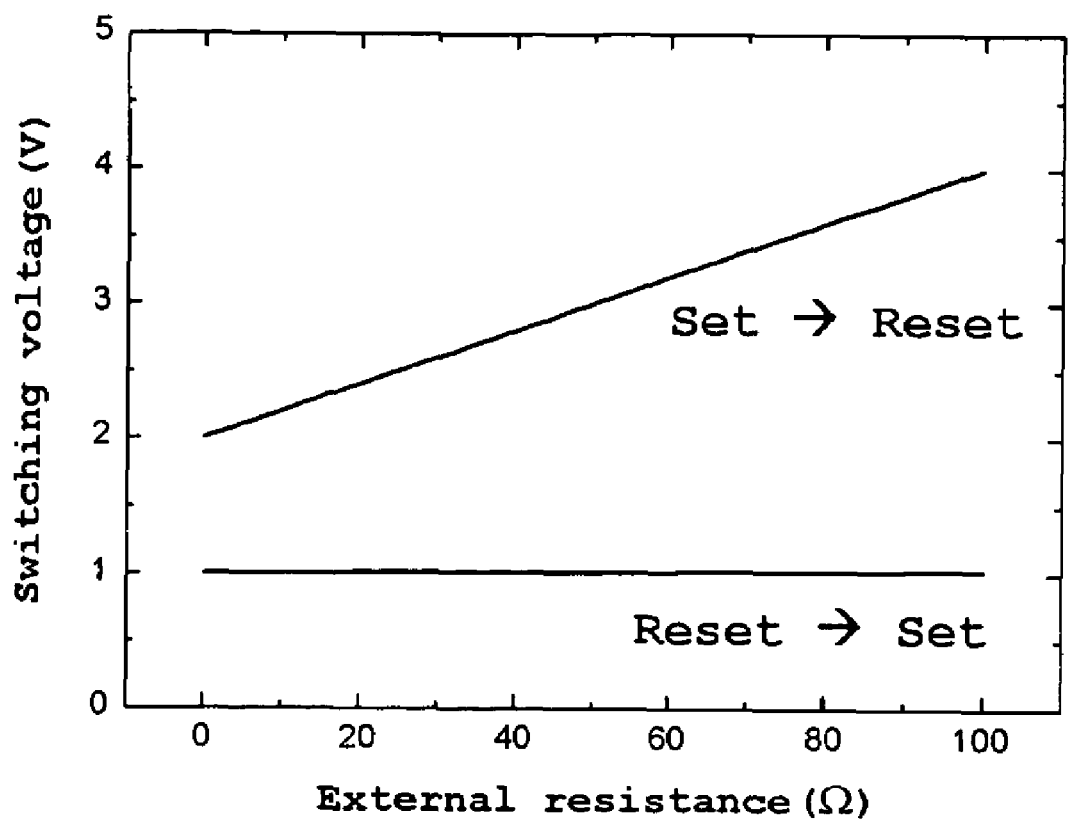
FIG. 6 is a graph showing variation in switching voltage depending on the resistance of the resistor part for controlling a switching window of the resistive memory device, according to the present disclosure.

As shown in FIG. 6, the switching voltage required from the set state to the reset state is linearly increased depending on the magnitude of external resistance (resistance of a resistor part for controlling a switching window). Meanwhile, in the reset state, since $V_{switch}$ is almost the same as $V_{total}$, the driving voltage is seldom changed, regardless of the magnitude of external resistance, upon switching from high resistance to low resistance. In this way, as the magnitude of external resistance is increased, the driving voltage in the set state is seldom changed, whereas the driving voltage in the reset state is increased, resulting in an increased switching window (FIGS. 4 and 6).

In addition, the memory device of the present disclosure may be used as WORM type memory. When the magnitude of external resistance of the memory device is considerably increased to a high state, the voltage required for switching to the low resistance state and then again to the high resistance state is greatly increased, and thus switching is impossible. Hence, the memory device of the present disclosure may be used as WORM type memory. That is, the memory device of the present disclosure may be used as non-volatile memory in the case where the magnitude of resistance of the resistor part for controlling a switching window is low, while it may be used as WORM type memory in the case where the magnitude of resistance of the resistor part for controlling a switching window is high. The principle of the present disclosure may be applied to various switching devices, as well as to the memory device.

A better understanding of the present disclosure may be obtained in light of the following example which is set forth to illustrate, but is not to be construed to limit the present disclosure.

EXAMPLE

1. Fabrication of Test Memory Device

Aluminum was deposited as a lower electrode using thermal evaporation on a substrate. Then, on the lower aluminum electrode, a P3HT (poly-3-hexylthiophene) solution was applied using spin coating and baked at 65° C. for 10 min, to form an organic memory part. Subsequently, an upper Au electrode was deposited on the memory part using thermal evaporation, to fabricate a test device. As such, the organic memory part was 50 nm thick, and the electrode was 80 nm thick, the thickness of each layer being measured using an alpha-step profilometer. A ceramic resistor, acting as a resistor part for controlling a switching window, was connected in series to the outside of the device. The thickness of the electrode to be deposited was controlled using a quartz crystal monitor.

2. Measurement of Switching Window of Test Device

Figure 7:
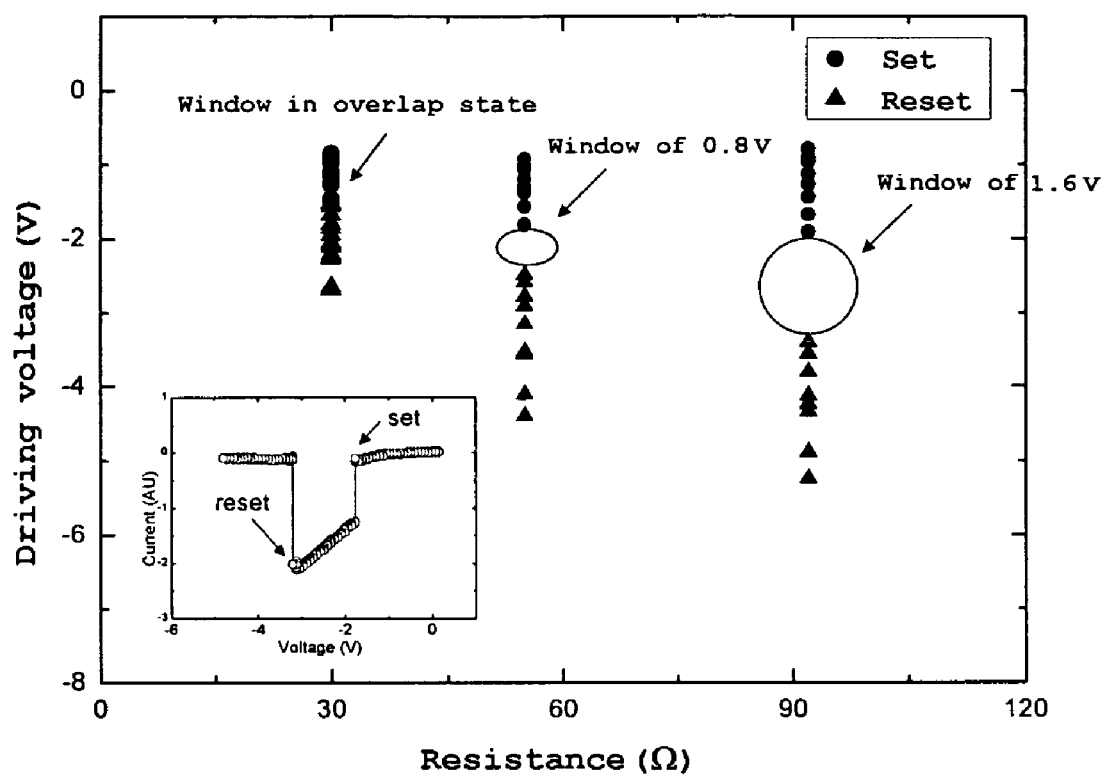
FIG. 7 is a graph showing variation in driving voltage depending on the resistance of the resistor of the resistive memory device, according to the present disclosure.

Upon operation of the test device, the driving voltage varying with the magnitude of the resistance of the resistor part for controlling a switching window was measured. The results are shown in FIG. 7. As is apparent from FIG. 7, in the case where the resistance of the resistor part for controlling a switching window was 30Ω, the switching window was zero. Further, when the resistance was changed to 60Ω, the switching window was increased to about 0.8 V. Furthermore, when the resistance of the resistor part for controlling a switching window was 90Ω, the switching window was increased to 1.6 V. Thus, in the resistive memory device of the present disclosure, as the magnitude of the resistance of the resistor part for controlling a switching window was increased, the driving voltage (●) in the set state was seldom changed, whereas the driving voltage (▲) in the reset state increased, therefore resulting in a larger switching window.

3. Assay of Switching Reproducibility of Test Device

Figure 8:
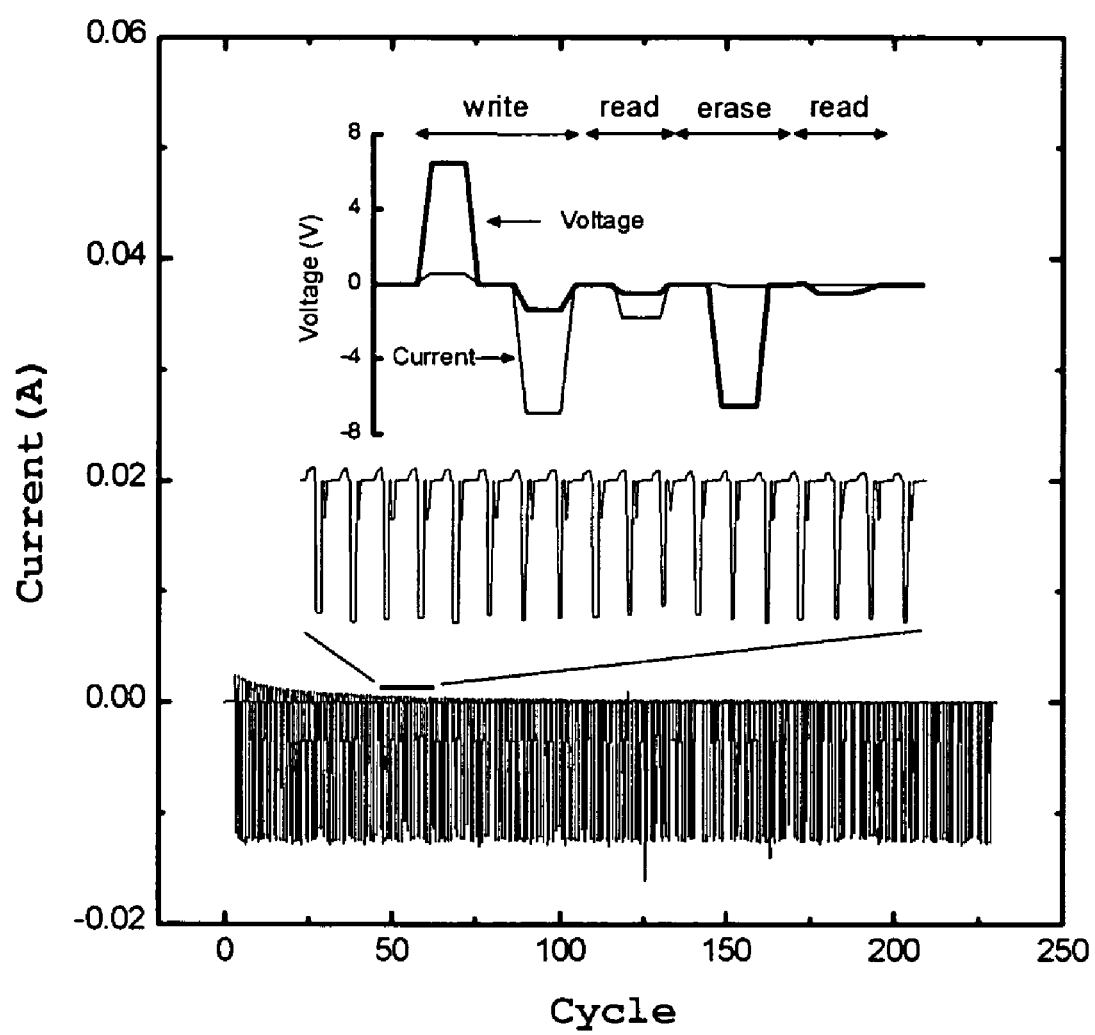
FIG. 8 is a graph showing switching reproducibility of the resistive memory device of the present disclosure.

An external resistor of 50Ω was connected in series to the test memory device to assure a memory window. Thereafter, pulse voltage was applied to the test device and switching cycle was measured. The results are given in FIG. 8. The pulse voltages of +7 V, −1.5 V, −0.5 V, −6 V, and −0.5 V were sequentially applied to each cycle, in which +7 V and −1.5 V correspond to switching voltages in the set state, −0.5 V is a voltage for reading, and 6 V corresponds to switching voltage in the reset state for erasing. As a result of conducting a cycling process 200 times or more, the memory device of the present disclosure could be confirmed to realize high reproducibility of 90% or more.

4. Assay of WORM type Properties

Figure 9A:
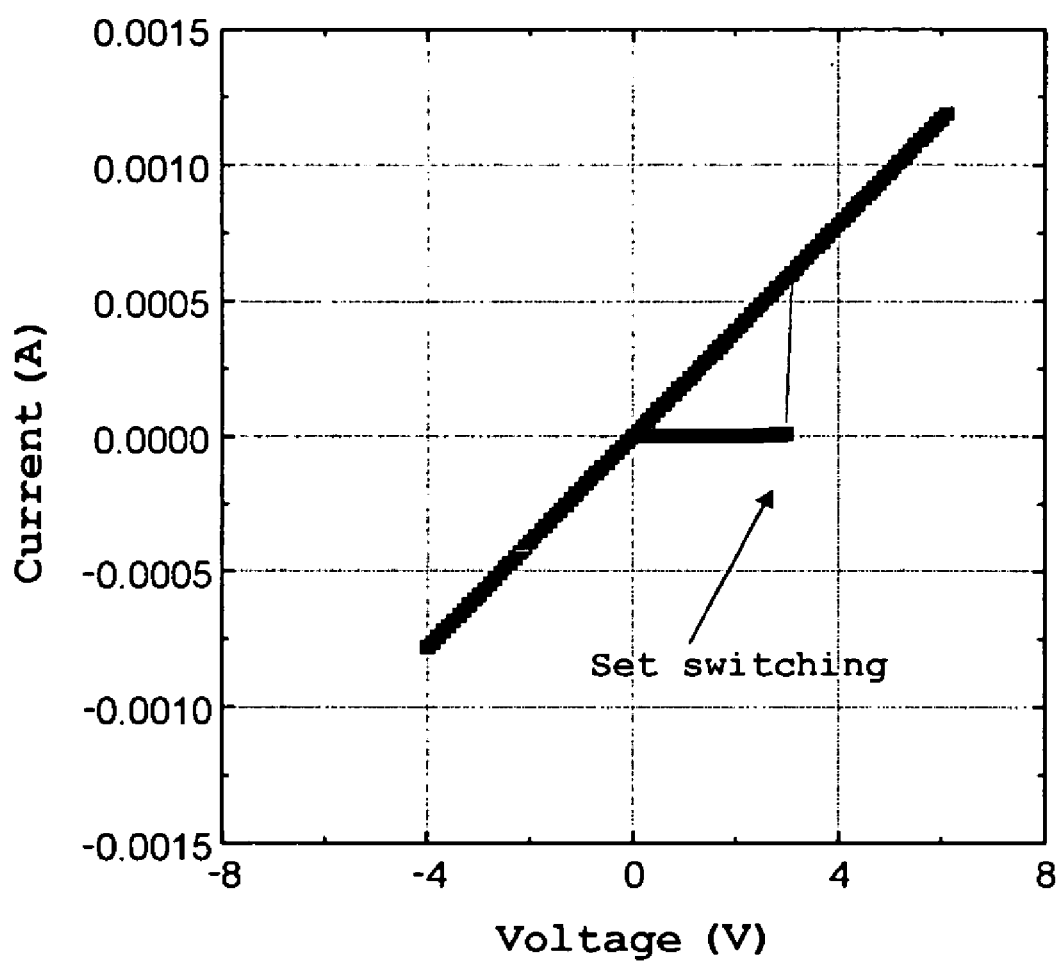
FIGS. 9A and 9B are graphs showing WORM type properties of the resistive memory device of the present disclosure.
Figure 9B:
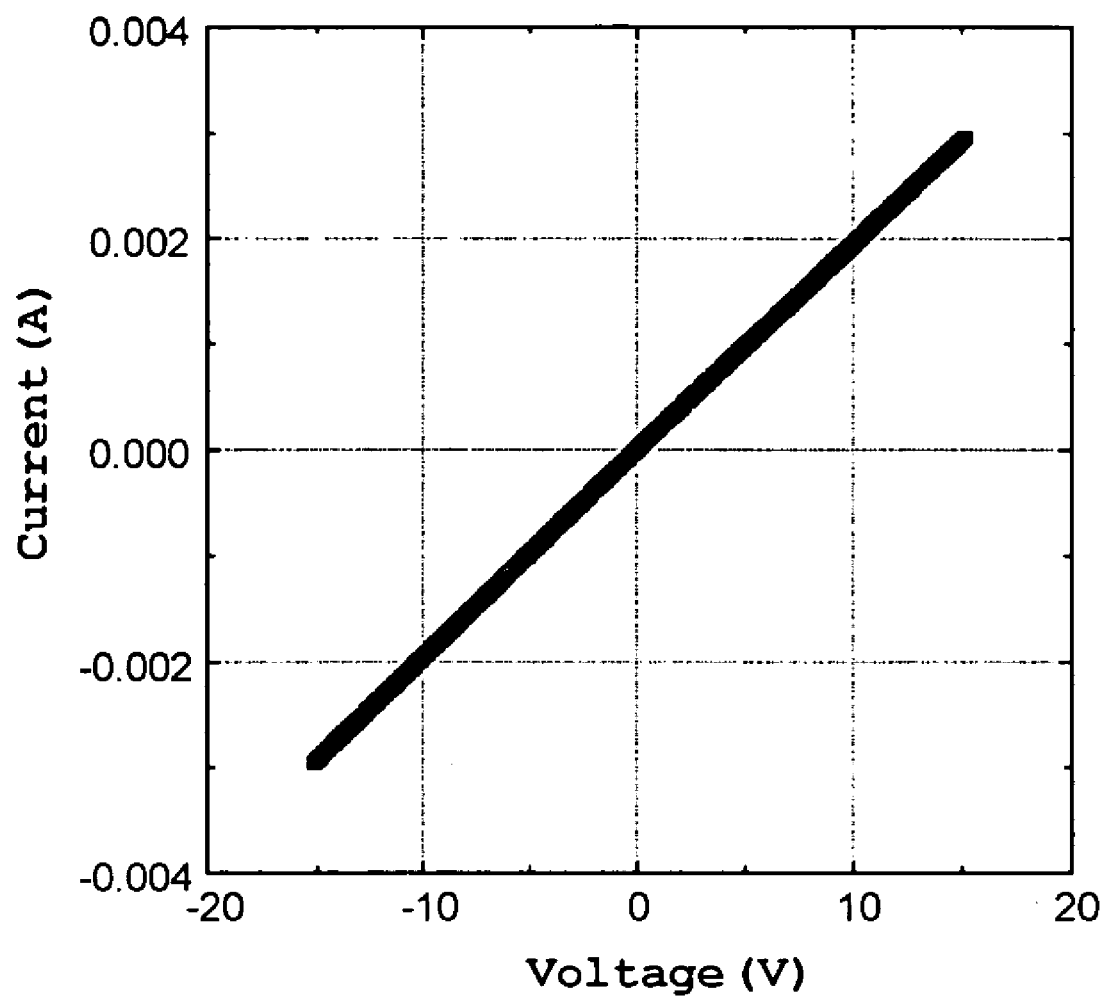

In order to confirm whether the resistive memory device of the present disclosure is usable as a WORM type memory device, a ceramic resistor of 5 kΩ, acting as a resistor part for controlling a switching window, was connected in series to the test device. After the device was set switching at 3 V, it was observed whether reset switching occurred upon application of 15 V. The I-V graphs are shown in FIGS. 9A and 9B. It can be seen that the device is set switching at 3 V, as in FIG. 9A, but is not reset switching at ±15 V (FIG. 9B).

As previously described herein, the present disclosure provides a resistive memory device having a resistor part for controlling a switching window. The resistive memory device of the present disclosure can sufficiently assure a difference (switching window) between voltage (or current) inducing a set state and voltage (or current) inducing a reset state, thus exhibiting excellent operational reliability.

Moreover, the memory device of the present disclosure is realized by additionally providing only the resistor part for controlling a switching window to conventional or future resistive memory devices, and therefore can be easily fabricated and can be applied to all current and voltage driving type resistive devices.

Although the preferred embodiments of the present disclosure have been disclosed for illustrative purposes, those skilled in the art will appreciate that various modifications, additions and substitutions are possible, without departing from the scope and spirit of the disclosure as disclosed in the accompanying claims.

What is claimed is:

1. A memory device, comprising:
   a lower electrode;
   a resistor part connected between a memory part and a power source for supplying current to the memory part, the resistor part being configured to control a switching window of the memory device;
   a resistive memory layer; and
   an upper electrode, in the recited sequence, wherein the resistor part has a resistance that sets a voltage range of the switching window of the memory part to a predetermined range.

2. The memory device as set forth in claim 1, wherein the memory device further comprises a metal layer between the resistor part for controlling the switching window and the resistive memory layer.

3. The memory device as set forth in claim 1, wherein the resistor part has a substantially uniform thickness.

4. The memory device as set forth in claim 1, wherein the resistor part is in a form of a thin metal wire.

5. The memory device as set forth in claim 1, wherein the resistance of the resistor part is set sufficiently high such that the memory device is a Write-Once-Read-Memory (WORM) device.

* * * * *